(12) United States Patent
Glenn et al.

(10) Patent No.: US 6,844,929 B2
(45) Date of Patent: Jan. 18, 2005

(54) APPARATUS AND METHOD FOR HOLDING AND TRANSPORTING THIN OPAQUE PLATES

(75) Inventors: Joe M. Glenn, Tucson, AZ (US); Clive M. Pridmore, Tucson, AZ (US); Bryan G. Castner, Tucson, AZ (US); Klaus Freischlad, Tucson, AZ (US)

(73) Assignee: Phase Shift Technology, Tucson, AZ (US)

( * ) Notice: Subject to any disclaimer, the term of this patent is extended or adjusted under 35 U.S.C. 154(b) by 110 days.

(21) Appl. No.: 10/411,019

(22) Filed: Apr. 9, 2003

(65) Prior Publication Data
US 2004/0201843 A1 Oct. 14, 2004

(51) Int. Cl.[7] ............................................... G01N 21/01
(52) U.S. Cl. ..................... 356/244; 279/106; 269/20; 118/503
(58) Field of Search ............................. 356/244, 246, 356/237.1–237.5, 394; 279/106; 269/20; 118/500, 503, 728, 730

(56) References Cited

U.S. PATENT DOCUMENTS

| | | | |
|---|---|---|---|
| 3,999,866 A | * 12/1976 | Mathisen | ..................... 356/244 |
| 4,860,229 A | 8/1989 | Abe | |
| 5,096,291 A | * 3/1992 | Scott | ........................... 356/244 |
| 5,995,226 A | 11/1999 | Abe | |
| 6,504,615 B1 | 1/2003 | Abe | |
| 6,606,154 B1 | * 8/2003 | Oda | ........................... 356/244 |
| 6,702,302 B2 | * 3/2004 | Smedt et al. | ................ 279/106 |
| 6,757,059 B2 | * 6/2004 | Ebert et al. | .................. 356/244 |

FOREIGN PATENT DOCUMENTS

| | | | |
|---|---|---|---|
| JP | 363250135 A | * | 10/1988 |
| JP | 401009346 A | * | 1/1989 |
| WO | 00 79245 A1 | | 12/2000 |
| WO | 01 77612 A1 | | 10/2001 |

* cited by examiner

Primary Examiner—Hoa Q. Pham
(74) Attorney, Agent, or Firm—LaValle D. Ptak (57) ABSTRACT

A device is disclosed for supporting semiconductor wafers or other polished, opaque plates for processing or metrology in a vertical orientation, where the wafer loading and unloading occurs in a horizontal orientation. The device consists of a pallet designed with an opening such that both sides of the wafer are exposed. The wafer is loaded into the pallet to rest on three fixed rest members extending a short distance into the opening. Moving clamp members on the frame are located for movement toward or away from the corresponding rest members. Two cylindrical rest pins are located on axes parallel to the central axis of the opening to permit the wafer to rest under the force of gravity on the rest pins when the frame is rotated to its vertical position. Special provisions are made to minimize the effects of mechanical vibration of the wafer while insuring a robust physical restraint of the wafer within the apparatus without inducing mechanical stresses which could influence the shape of the wafer.

33 Claims, 12 Drawing Sheets

APPARATUS AND METHOD FOR HOLDING AND TRANSPORTING THIN OPAQUE PLATES

BACKGROUND

This invention relates to apparatus for supporting relatively thin plates of material having opposed parallel surfaces, such as semiconductor wafers, for processing or testing in a metrology system.

In the manufacture of devices from semiconductor wafers, such as silicon wafers, the production and quality control processes require a precise knowledge of the characteristics of the wafer, such as its flatness, its thickness, and other characteristics. Particularly important are accurate profiles of the surfaces of the wafer in conjunction with measurements of the shape and thickness of the wafer at all points on its surface. Current processing requires, for many situations, profiling and flatness measurements of both the front and back surfaces of such wafers.

In the past, measurements of thickness variations were accomplished by means of capacitive probes and the like, such as disclosed in the United States patent to Abbe U.S. Pat. No. 4,860,229. As disclosed in this patent, a wafer is mounted on a rotatable vacuum chuck in a wafer flatness station; and a capacitive probe is placed in a position to provide outputs indicative of the wafer thickness as the wafer is rotated beneath the chuck. The data which is provided by the capacitive thickness sensor then is provided to a processor for computing a flatness profile of the wafer.

Optical profiling of semiconductor wafers also has been effected by means of interferometric systems using phase shifting to produce a profile of the wafer. In systems which have been used in the past, such profiling typically employed a vacuum chuck to hold the wafer by attracting its reverse side to the chuck, which ostensibly is a flat plane. However, any variations in the flatness of the plane of the vacuum chuck surface are imparted directly to the wafer, since it is highly flexible. In addition, if the wafer itself is naturally bowed, the pulling of the vacuum chuck on the wafer will remove the bowing; so that an accurate profile or flatness measurement of the wafer as it actually exists does not occur. Current wafers are being manufactured in ever increasing diameters, many ranging between 200 mm or 300 mm in diameter (approximately 8" or 12"); so that when such a wafer is placed on a surface or is held horizontally at its edges, it tends to sag under the effects of gravity, thereby making accurate flatness and profiling measurements difficult, if not impossible. This deformation of the wafer may be incorporated in the measurement results; so that its flatness and thickness cannot be obtained with sufficient accuracy.

Another problem with using vacuum chucks to hold the wafer during the profiling or measuring operations, whether capacitive measurements or interferometric optical measurements are being used, is that there is a physical contact between the vacuum chuck and the surface of the wafer adjacent the vacuum chuck. This can result in the impartation of defects to the wafer from the vacuum chuck itself.

Current semiconductor processing frequently requires semiconductor wafers which are polished on both surfaces. Thus, it is desirable to provide flatness measurement and profiling of both sides of the wafer. In the past, this frequently has been accomplished with an interferometer by holding the wafer, such as in a vacuum chuck as mentioned above, in one position, to allow the optical scanning of one side of the wafer. After the wafer has been scanned on one side, it then is physically reversed and placed back in the interferometer for scanning the opposite side. Obviously, this sequential processing is time consuming. The movement and physical repositioning of the wafer which is necessary also makes it very difficult to obtain accurate thickness variation measurements of the wafer, since the manipulation subjects the entire process to potential error. The flatness measurement and profiling of opposite sides of a wafer in a sequential manner also more than doubles the processing time which is required when only one surface is to be subjected to the flatness measurement and profiling.

Two United States patents, to Abe U.S. Pat. Nos. 5,995,226 and 6,504,615, purport to show an optical apparatus to simultaneously measure both surfaces of a semiconductor wafer. In the disclosures of both of these patents, a wafer is shown as positioned vertically between a pair of identical interferometers, which then provide signals to a computer or a pair of computers representative of the flatness and profile of the opposing front and back surfaces of the wafer. In neither of these patents is there any disclosure of the manner in which the wafer is held vertically in order to allow the simultaneous optical or interferometric measurement of the two sides of the wafer.

Two World Intellectual Property Organization patents, to Mueller et al., No. WO 01/77612 A1, and to Sullivan et al., No. WO 00/79245 A1, purport to show an optical apparatus for a similar purpose, where a semiconductor wafer is positioned vertically while both surfaces are simultaneously presented for optical analysis. In both patents, there is disclosure of a method of support of the wafer using an on-edge three-point kinematic mount consisting of clips having spherical or semi-spherical tangentially mounted contacts, mounted to a support plate and arranged to be substantially coplanar, where the clips are adjustable to provide for slight irregularities in the shape of the wafer. There is no disclosure made as to the method and apparatus of clip adjustment, nor is there disclosure made as to the method and apparatus for the loading and unloading of the wafer to and from the clips, nor is there disclosure made as to the method and apparatus for compensation of normal production variations in wafer thickness and diameter.

An important requirement for the shape metrology of wafers is the measurement of the intrinsic shape, i.e. the shape without any external forces acting on the wafer. The shape of thin, large diameter wafers is very easily distorted by external forces, by gravitational forces, as well as by forces introduced by the holding mechanism. Gravitational effects are best minimized by holding the wafer in a vertical position where the gravitational force vector is in the wafer plane. However, standard wafer handling equipment handles wafers in a horizontal orientation. Additionally, in order to avoid or minimize holding effects on the wafer shape, special care has to be taken in the design of the holding mechanism.

In highly sensitive metrology systems, vibrations of the wafer or test piece are detrimental to the measurement process. The main vibration mode of wafers consists of bending vibrations with excursions normal to the wafer plane, i.e. the wafer shape fluctuates during vibrations. Thus, a mount optimized for not affecting the wafer shape cannot easily affect the vibrations of the wafer. Ambient vibration is ever-present in the metrology process in that the sources of acoustic and seismic periodic displacement are many; they may emanate on a continuous basis and in an unpredictable manner from facility foundations and floors, walls, climate control systems, nearby process equipment and machinery, and from the very equipment and mechanisms used to support and perform a particular metrology process. While a variety of vibration attenuation methods are commonly employed to reduce the effects of vibration on the metrology process, such as actively damped equipment pedestals and supports and passive dampers of numerous varieties, not all energy is dissipated before it is transmitted to the wafer. Additionally, air motion in the vicinity of the wafer can impart vibration directly to the wafer in that a large, thin, semi-rigid sheet of material can become a resonating membrane when it is supported on its edge.

It is desirable to provide an apparatus for holding wafers or other thin objects that stably and accurately holds the object in a vertically oriented position while minimizing the application of distorting stress to the wafer, and attenuates vibration transmitted from the environment to the holding apparatus while additionally attenuating vibration of the object at the point of contact for subsequent processing, such as interferometric profiling.

SUMMARY OF THE INVENTION

It is an object of this invention to provide an improved device for positioning relatively thin sheets or wafers of material.

It is another object of this invention to provide an improved device for positioning relatively thin sheets or wafers of material in a vertical orientation for testing in a metrology system and/or processing.

It is an additional object of this invention to provide a transporting and positioning pallet for holding relatively thin sheets or wafers of material in a vertical orientation with a minimum amount of distortion of the wafer or sheet of material.

It is a further object of this invention to provide a pallet for receiving relatively large diameter wafers of semiconductor material in an opening exposing opposite sides of the wafer, with clamping and rest members located to clamp the edges of the wafer directly through the thickness thereof at the edge i.e. opposed-force, and with a force selected to hold the wafer in position when it is rotated to a vertical orientation, without applying distorting stresses to the wafer.

It is yet another object of this invention to provide vibration damping of a wafer holding pallet so as to minimize the effects of vibration on the wafer by way of reducing the duration and/or amplitude of acoustic and seismic oscillations.

In accordance with a preferred embodiment of the invention, a device for vertically positioning relatively thin wafers of material, such as polished semiconductor wafers, for imaging in an interferometer system, includes a frame surrounding an opening dimensioned to be equal to or greater than the external diameter or width/length of a wafer. Initially, the frame is located in a horizontal orientation; and a wafer is moved horizontally into position over the opening and then lowered to rest on three rest members, which are spaced apart at the edge of the opening. Corresponding clamp members, which are diametrically opposed to the rest members, then are moved to clamp the wafer between the rest members and the clamp members. The frame then is rotated to a vertical position to support the wafer in its vertical orientation on two rest pins.

DETAILED DESCRIPTION

Reference now should be made to the drawings, in which the same reference numbers are used throughout the different figures to designate the same or similar components. Before entering into a discussion of the preferred embodiment, however, further discussion of the environment in which the apparatus, shown in the various figures is used, is considered in order.

Semiconductor wafers are continuing to be made in increasingly large diameters. Currently produced semiconductor wafers are made in diameters of 200 mm to 300 mm, with a thickness of approximately 750 microns. Some wafers also are polished to provide smooth, flat finishes on both the front and back surfaces, since both surfaces are important in processing high density electronic circuits which are formed on chips made from the wafers. Flatness measurements and profiling of both surfaces of a dual-sided polished semiconductor wafer are desired; and for subsequent processing steps, it also is desirable to obtain measurements of the thickness variations of the wafers at all points of the surface area. Although capacitive sensors have been adequate in the past, the achievable high accuracy and spatial resolution of such sensors are limited, and are becoming inadequate for future wafer requirements. As a result, it is desirable to provide optical interferometric profiling and thickness determinations for such relatively large diameter thin wafers.

As mentioned above, the physical characteristics of such wafers, coupled with the fact that both sides need to be profiled or mapped, precludes the orientation of the wafers on a horizontal platform or table in order for accurate and relatively rapid measurements to be made. It also is necessary to support the wafer only at its perimeter, such that the top and bottom (front and back) surfaces are simultaneously presented to the optics of the interferometers. This requires that the wafer be positioned vertically to minimize axial sag. At the same time, the wafer must be constrained in a manner so that the influences of mechanical stress and vibration are minimized, but where stability and positional repeatability are maximized. This invention is designed to accomplish these purposes.

Figure 1:
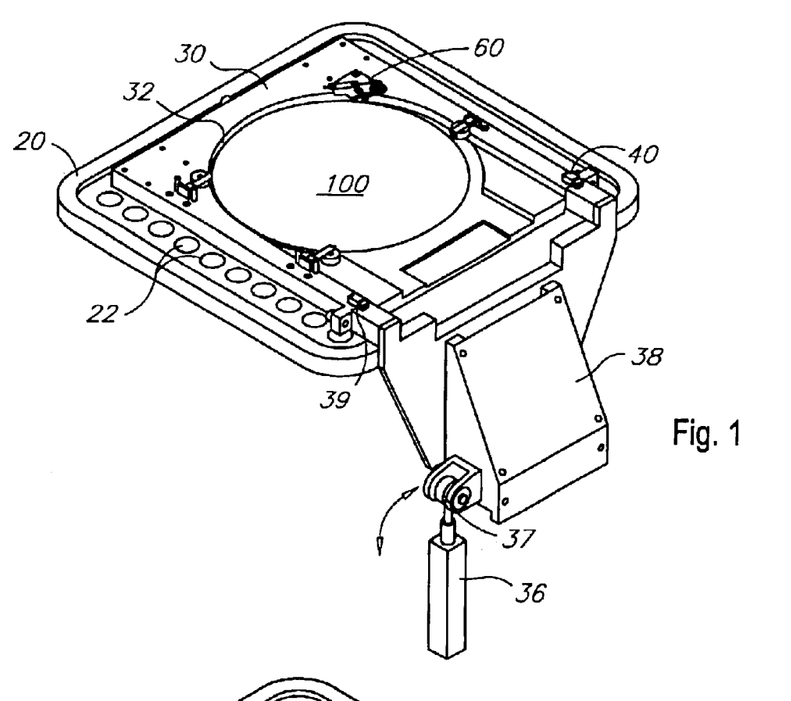
FIG. 1 is a top left perspective view of a preferred embodiment of the invention in a horizontal orientation.
Figure 2:
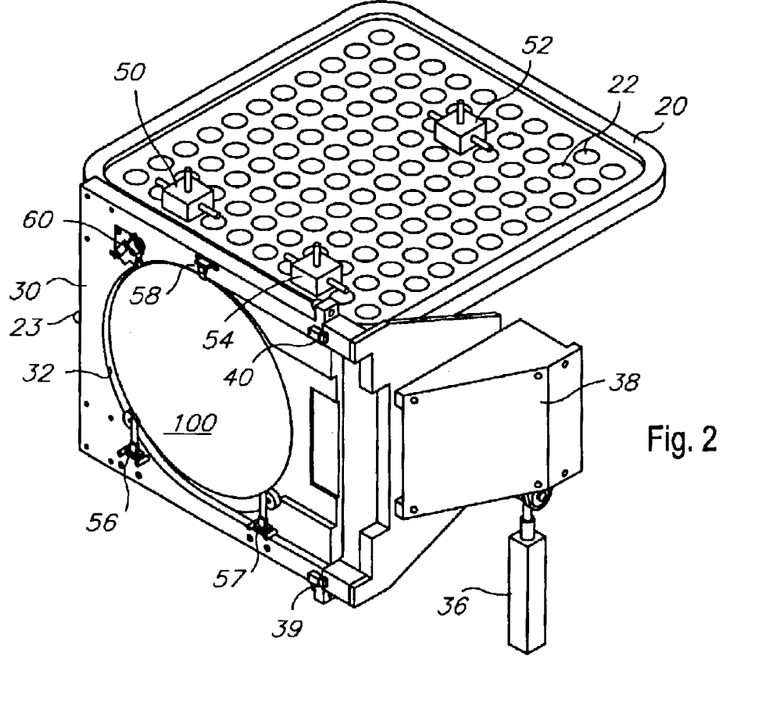
FIG. 2 is a top left perspective view of a preferred embodiment of the invention rotated 90° to a vertical orientation.

FIGS. 1 and 2 illustrate two different positions of a pallet or frame 30 which is used to transport and position a semiconductor wafer or other opaque polished plate, such as magnetic disc substrates, gauge blocks and the like. A support table 20 is located horizontally near the position of the interferometer system with which the wafer holding pallet 30 is used.

Figure 3:
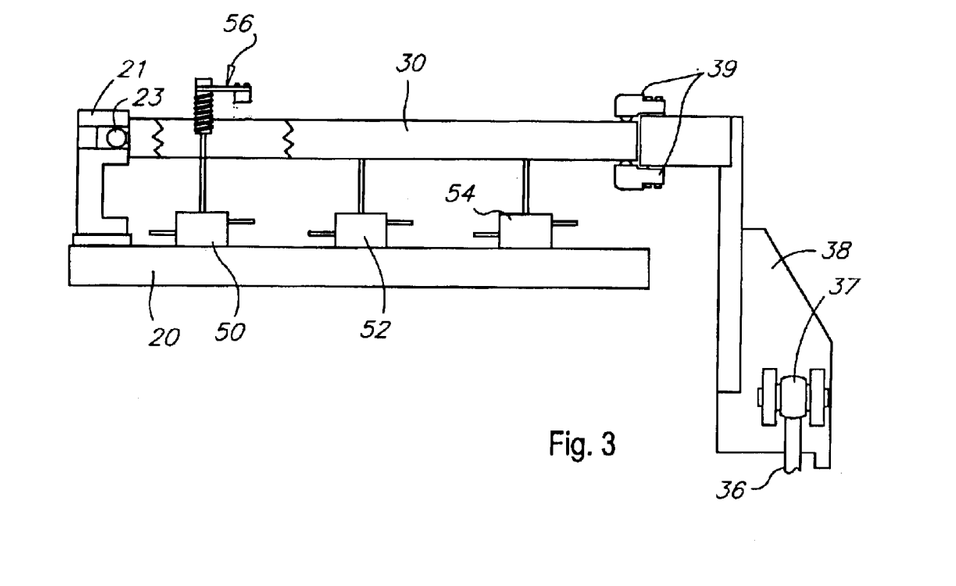
FIG. 3 is a side view of the apparatus shown in FIG. 1 illustrating features of a preferred embodiment of the invention.

The pallet 30 is held by a clamping mechanism supported on a vertical post 36 and including a clamping apparatus 38 having a pair of clamping or holding jaws 39 and 40 attached to one edge of the wafer pallet 30 in a spaced position over the table 20, as is shown most clearly in FIG. 3. The pallet clamping apparatus 38 is rotated on the end of the post 36 at a pivot 37 to allow the pallet 30 to be moved from the horizontal orientation shown in FIG. 1 to a vertical orientation shown in FIG. 2. Once the pallet 30 is in the orientation shown in FIG. 2, the pallet 30 may be moved by apparatus (not shown) into an interferometer (also not shown), for further testing of the wafer. The present preferred embodiment of the invention is directed to the manner of loading and holding a wafer 100 in place to present it to additional apparatus for the interferometric profiling, thickness measurement, or other operations to be conducted on the wafer 100.

As shown in FIGS. 1 and 2, the pallet 30 has a relatively large circular opening 32 formed directly through it. It is in this opening that a semiconductor wafer 100 or other suitable polished plate is to be mounted and presented for subsequent processing in the interferometric apparatus.

Figure 10:
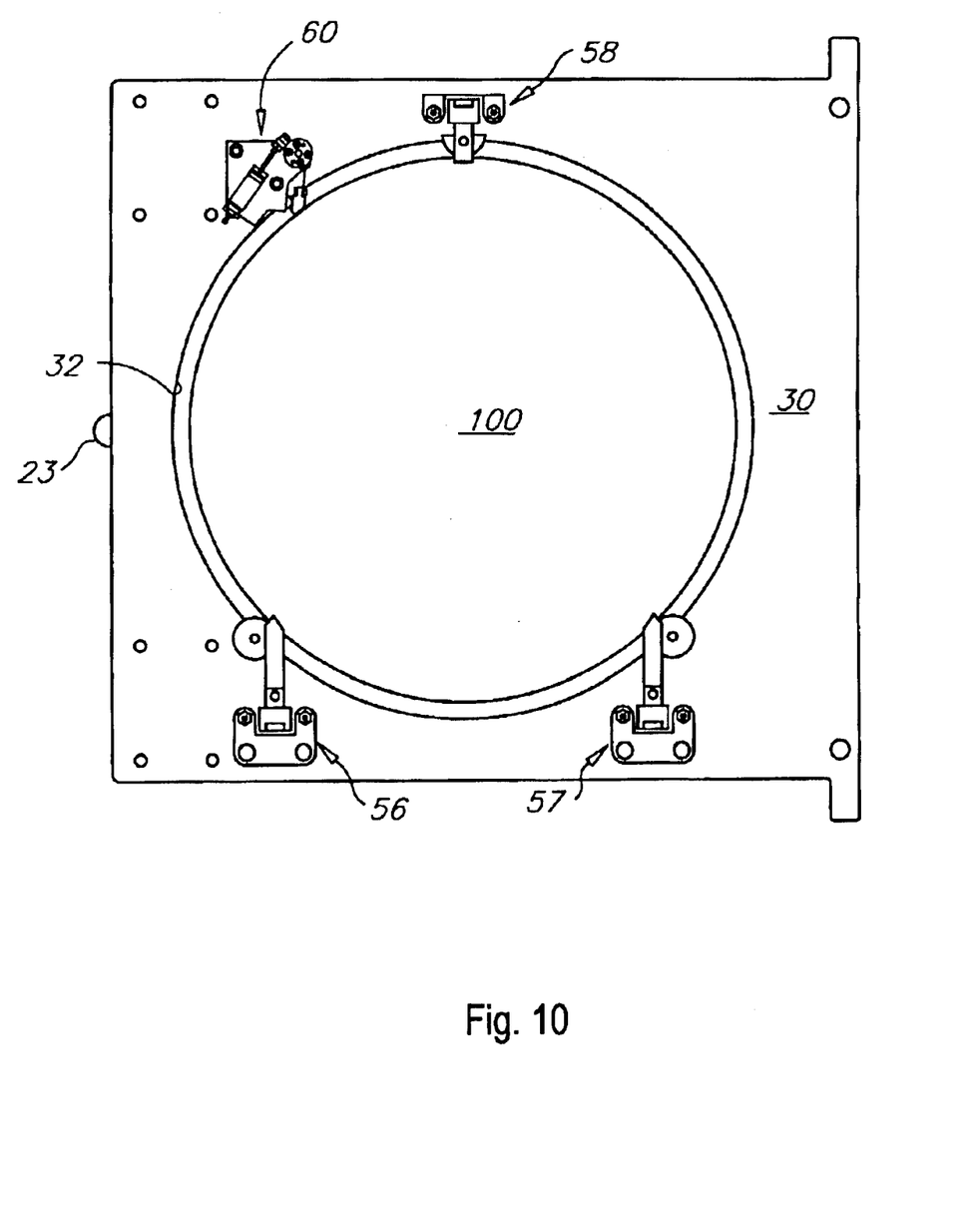
FIG. 10 is a side view of the embodiment of the invention shown in the orientation of FIG. 2 and illustrating relative position of various component parts.

As shown in FIGS. 1 and 2, the table 20 has a plurality of holes 22 through it. Located at three spaced points on the top of the table 20 are solenoids 50,52 and 54, each having a vertically oriented piston which may be extended upwardly from the position shown in FIG. 2 (and in the two right-hand solenoids 52 and 54 of FIG. 3) to an extended position, as shown with the solenoid 50 in FIG. 3. These solenoids and their extending pistons underlie corresponding spring-loaded clamping elements or clamping jaws formed as part of clamping assemblies or stations 56,58 and 57, respectively. These clamping assemblies are shown in greater detail in the locations indicated in FIG. 10, and all three also are shown in FIGS. 1 and 2. It should be noted that it is advantageous that the two clamping assemblies or stations 56 and 57 are located on symmetrically opposite positions in third and fourth quadrants of the circular opening 32 when the pallet 30 is oriented in its vertical position as shown in FIGS. 2 and 10, and that the clamping assembly or station 58 is located directly at the top of the opening 32 in the pallet 30, as shown most clearly in FIGS. 2 and 10.

As shown in FIG. 3, when the pallet 30 is held in its horizontal position over the table 20, the left-hand end (as viewed in FIGS. 2,3 and 10) includes a projection 23, which is inserted optic 13 into a receptacle in a support member 21 located on the center of the right-hand edge of the table 20 to provide stability to the left-hand side of the pallet 30 during the loading and unloading of a semiconductor wafer 100 or other substrate into the pallet 30 for further handling.

When a wafer 100 or other substrate is to be loaded into the pallet for further processing, the solenoids 50,52 and 54 are operated to raise the actuators to the position shown in FIG. 3 for the solenoid 50. The actuators then press on the bottom of a spring-loaded block 84 in each assembly 56,57, 58 to raise the moving element of the clamp to the position shown for clamping assembly or station 56 in FIG. 3. Only one of the clamping stations is shown raised in FIG. 3; but it should be understood, however, that all three of the solenoids 50,52 and 54 are operated simultaneously to raise the movable portions of the clamping stations 56,57 and 58 to the position shown for the station 56 in FIG. 3.

With the clamping member 88,90 raised to the upper position, a semiconductor wafer 100 or other disc, such as a magnetic disc, then is moved from right to left (as shown in FIG. 1) to place the disc 100 under the movable portion 88,90 of the clamping stations 56,57,58 over the opening 32. The wafer 100 then is deposited in the opening to rest the edge of the wafer on three support points on three fixed hemispherical or semi-cylindrical pads 98 at each of the three stations 56,57,58. The pads 98 extend into the opening 32 a slight amount; so that the flat portion of the disc or wafer 100 immediately adjacent its edge rests on the three fixed pads 98 in the opening, with the remainder of the wafer 100, including the remainder of the edge of the wafer 100, being fully exposed in the opening 32 to permit interferometric profiling of essentially the entire surface of the wafer.

Figure 4:
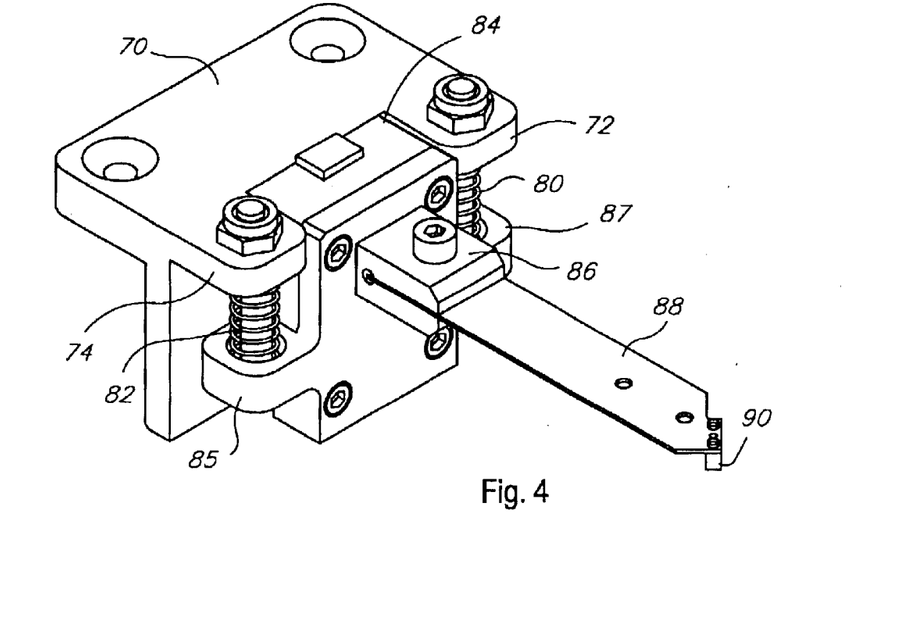
FIG. 4 is a detailed perspective view of a portion of the embodiment of the invention shown in FIGS. 1,2 and 3.

FIG. 4 illustrates the construction of the mechanism for a movable element of the clamping stations 56,57 and 58. All of the clamping stations are identical; so only one is shown in FIG. 4. The clamping station comprises a frame or basic part 70, which is attached to the main portion of the pallet frame 30 by means of suitable fasteners to orient the frame in the position shown in FIG. 10. This frame includes a pair of spaced apart ears 72 and 74, which support columns 73 and 75 (FIGS. 5 and 6), respectively, around which coil springs 80 and 82 are placed. These springs are captured between the ears 72 and 74 and corresponding ears 85 and 87 attached to a movable block 84; so that the block 84 may move up and down relative to the fixed frame 70, as is readily apparent from an examination of FIG. 4.

When the actuator pistons of the solenoids 50,52 and 54 are retracted, the assembly assumes the configuration shown in FIG. 4. When, however, the actuator pistons of the solenoids 50,52 and 54 are extended as shown for the solenoid 50 in FIG. 3, the actuator piston of the corresponding solenoid presses against the bottom of the corresponding block 84 to push the movable portion of the clamping assembly upward against the action of the springs 80 and 82, raising the block 84 to the position diagrammatically shown in FIG. 3 and shown in detail in FIG. 5.

Figure 5:
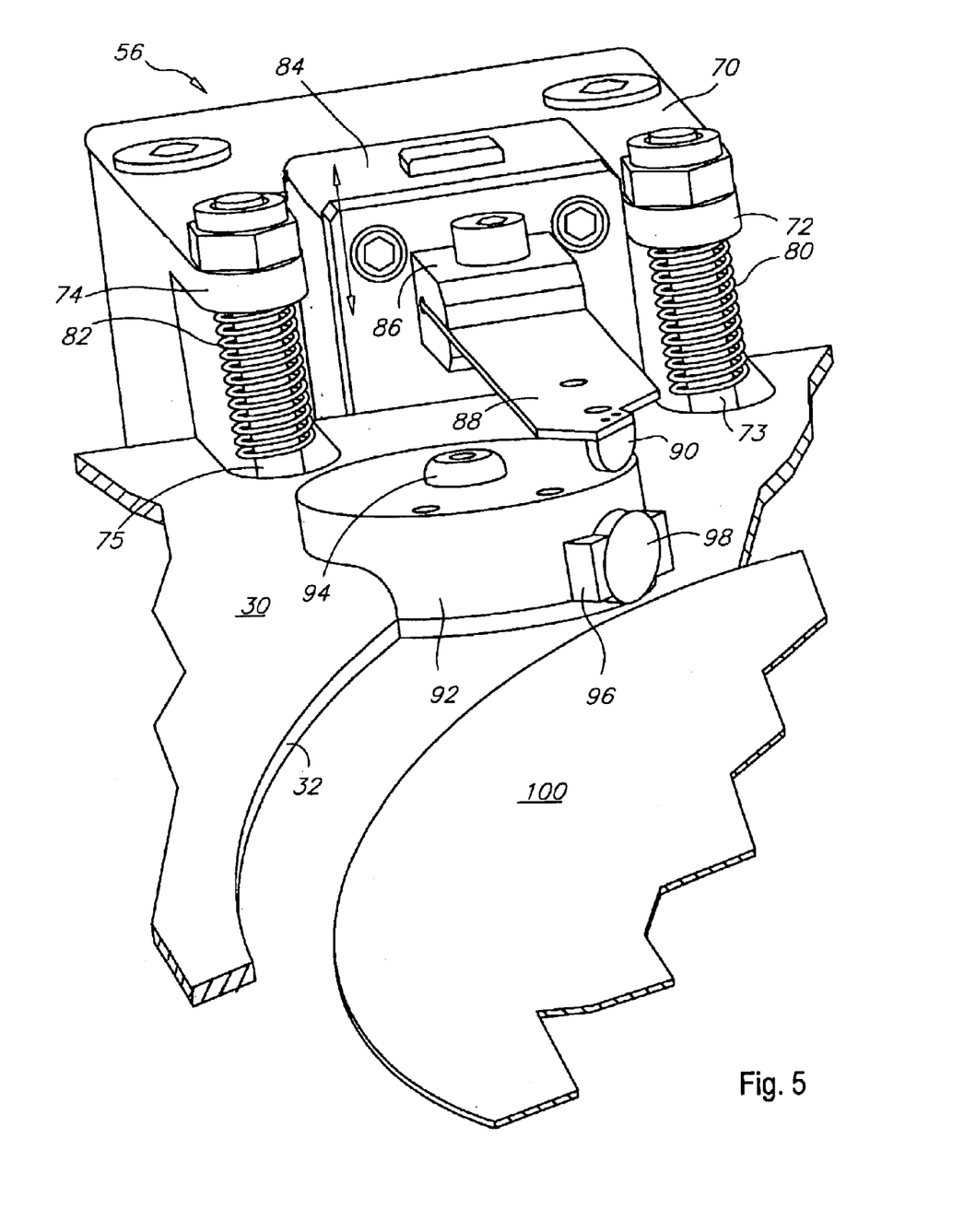
FIGS. 5 and 6 are diagrammatic representations of different operating positions of the portion of the invention illustrated in FIG. 4 and FIGS. 1 and 2.
Figure 6:
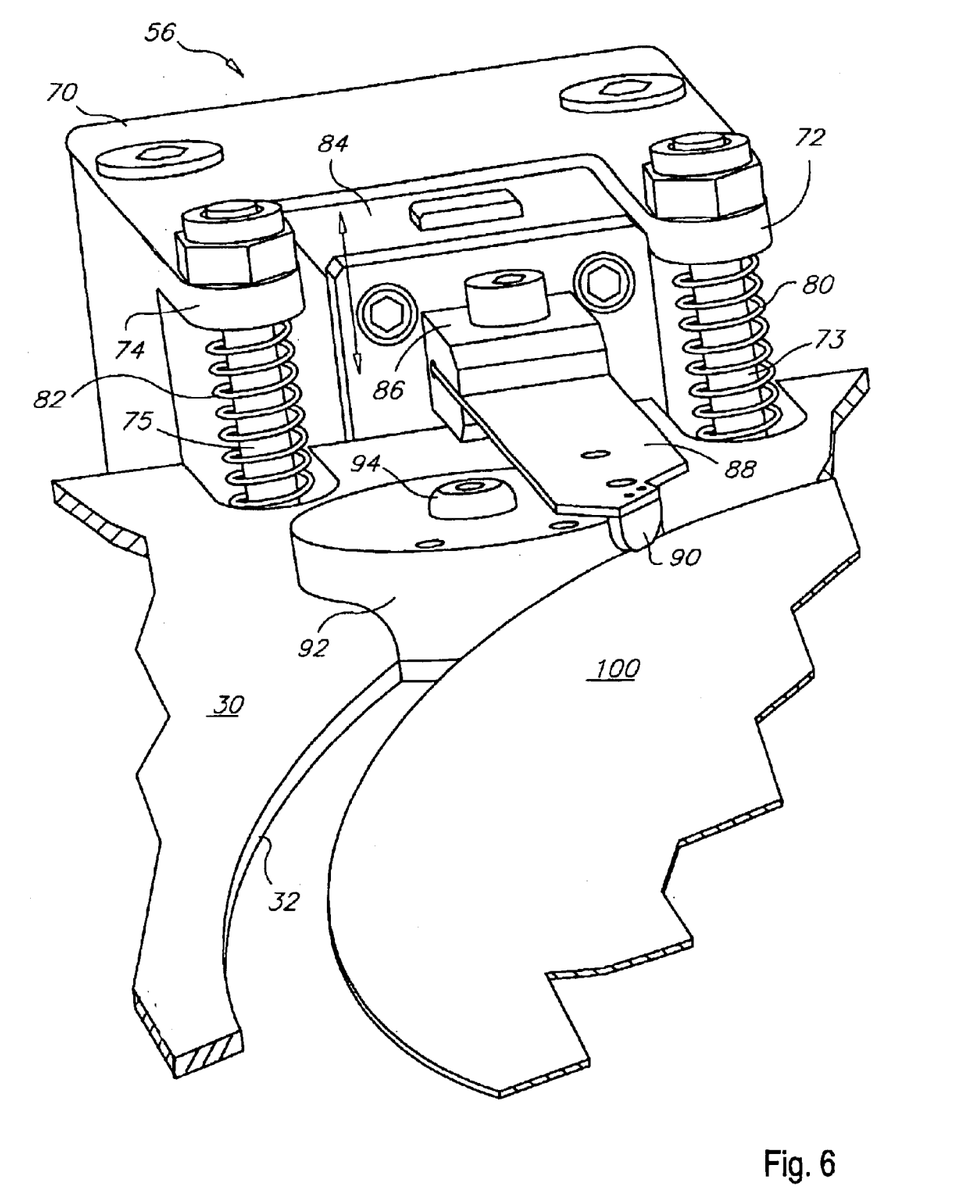

The block 84 of each of the stations 56,57 and 58 carries a leaf spring holder 86, which is securely attached or bonded to the block 84. The holder 86, in turn, clamps one end (the left end shown in FIG. 4) of a leaf spring 88, the other end of which has a semi-cylindrical or semi-spherical clamping member 90 attached to its underside. FIGS. 5 and 6 diagrammatically show the sub-assembly of FIG. 4, along with other components with which the sub-assembly operates, in its two states or positions of operation. In FIG. 5, the sub-assembly is shown in its raised or upward position where the springs 80 and 82 are compressed under the action of an actuator piston, such as the one shown for solenoid 50 in FIG. 3, to push the block 84 upward relative to the frame 70 to raise the moving clamp member 90 to the position shown in FIG. 5.

For each of the clamping stations 56,57,58, the clamping member 90 is located directly above and in an axial alignment with a corresponding fixed rest member 98 formed as a cylindrical or spherical section. The rest member 98 is held by a block. 96 attached to the outer circumference of a resting pin 92, also formed as a section of a cylinder. The pin 92 is secured to the pallet 30 by a fastener 94 and extends a short distance into the opening 32, as illustrated in both FIGS. 5 and 6.

As shown in FIG. 5, with the clamping member 90 raised by the leaf spring 88 to the upper position, a wafer 100 may be horizontally moved into place between the lower fixed support pad 98 and the corresponding clamping member 90 by a suitable conventional handler, such as a Brooks FX3000 FabExpress Handler. Once the wafer 100 is moved by the handler into place over the opening 32 as shown in FIG. 1, to the position shown in FIG. 6, the solenoids 50,52 and 54 are released to allow the block 84 to drop to its lowermost position, where its movable semi-cylindrical or semi-spherical clamping member 90 presses onto the top side of the wafer 100, as viewed in FIG. 6, to clamp the edge of the wafer between the lower surface of the movable clamping member 90 and the upper circumference of the fixed rest pads 98. As stated previously, the centers of the members 90 and pads 98 are located directly opposite one another on a vertical line (when the apparatus is located in its horizontal position); so that the forces imparted to the wafer at the position where the members 90 and pads 98 touch both sides of the wafer 100, are direct compressive forces without imparting any radial load or bending moment to the wafer. Only a compressive load is seen across the material of the wafer 100.

The moving elements which place the moving clamp member 90 in contact with the upper surface of the wafer, as viewed in FIG. 6, are spring loaded by the leaf spring 88 to constrain the wafer 100 with only the amount of force necessary to ensure the contact between the wafer surface and the three fixed rest pads 98, which are located at the three stations 56,57 and 58. Typically, the force which is supplied by the spring is in the range of approximately 30 grams; so that overclamping is prevented, while still allowing the system to compensate for variations in thickness of different wafers 100 which are handled by the system.

Figure 7:
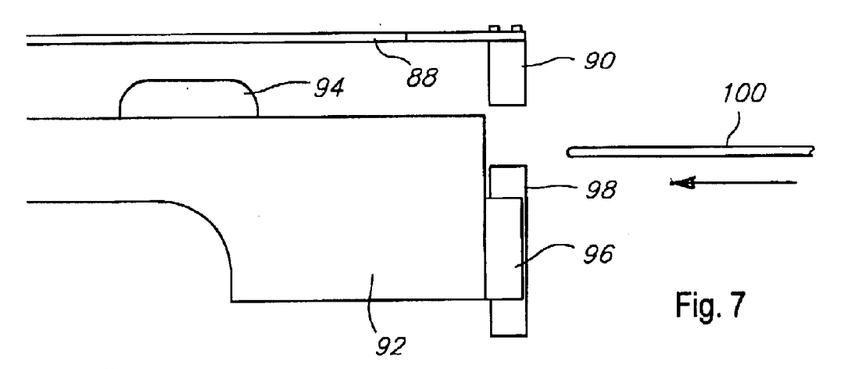
FIGS. 7,8 and 9 are diagrammatic representations illustrating a feature of the operation of a preferred embodiment of the invention.
Figure 8:
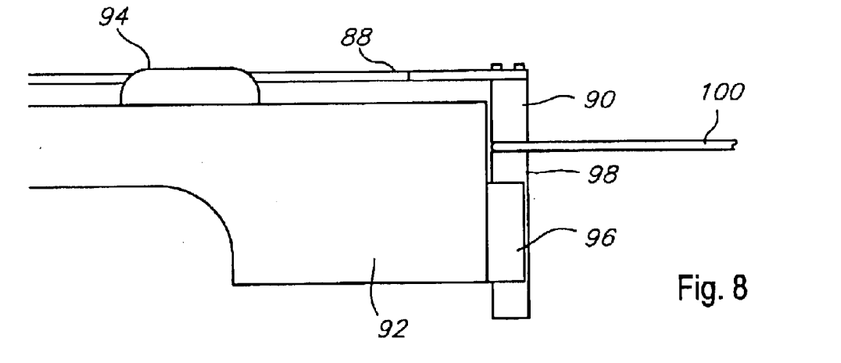

FIGS. 7,8 and 9 are diagrammatic representations of the different stages of holding, orienting and securing a wafer 100 in place in conjunction with the operation just described. FIG. 7 shows the relative positions of the parts as the wafer 100 is moved horizontally over the fixed rest pad 98 under the raised moving clamp member 90 which is held upwards to the position shown in FIG. 7 on the end of the leaf spring 88 by means of the operation previously described in conjunction with the solenoid 50 in FIG. 3. Once the wafer 100 is in place, the solenoids 50,52 and 54 are released, as described previously, to allow the blocks 84 to drop to the position shown in FIG. 6. This is diagrammatically illustrated in FIG. 8; and the edge of the wafer is clamped between the fixed rest pad 98 and the movable clamp member 90 on the flat portion of the wafer 100 immediately inward from the rounded or beveled edge portion. All of this is exaggerated in FIG. 8.

Figure 9:
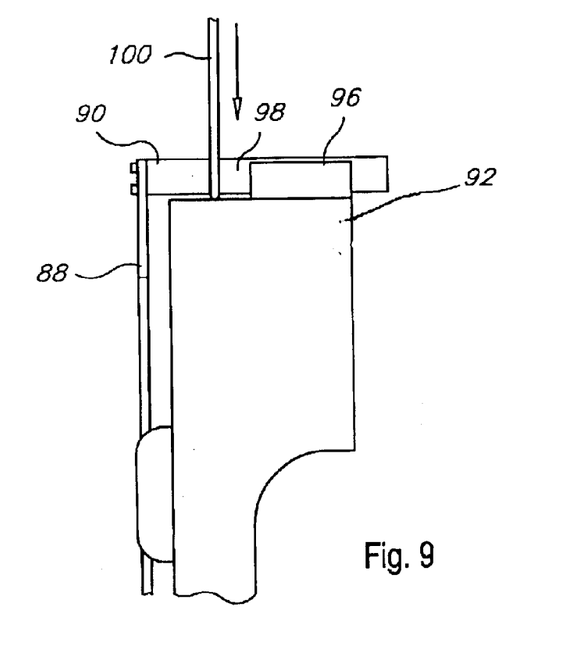

It should be noted that FIGS. 7,8 and 9 are not drawn to scale, but are utilized to depict the relative operation of the parts used to clamp the wafer 100 in the three clamping stations 56,57 and 58 to hold the wafer in place at its edges during the subsequent operations. It also should be noted in FIG. 8, that a typical wafer 100, when it is first placed in the opening 32 in the manner described and then clamped in place as shown in FIGS. 6 and 8, may or may not touch the circular support or rest pin 92, since that pin, when the wafer is loaded in the horizontal position shown in FIG. 1, is oriented with its axis vertical.

Figure 13:
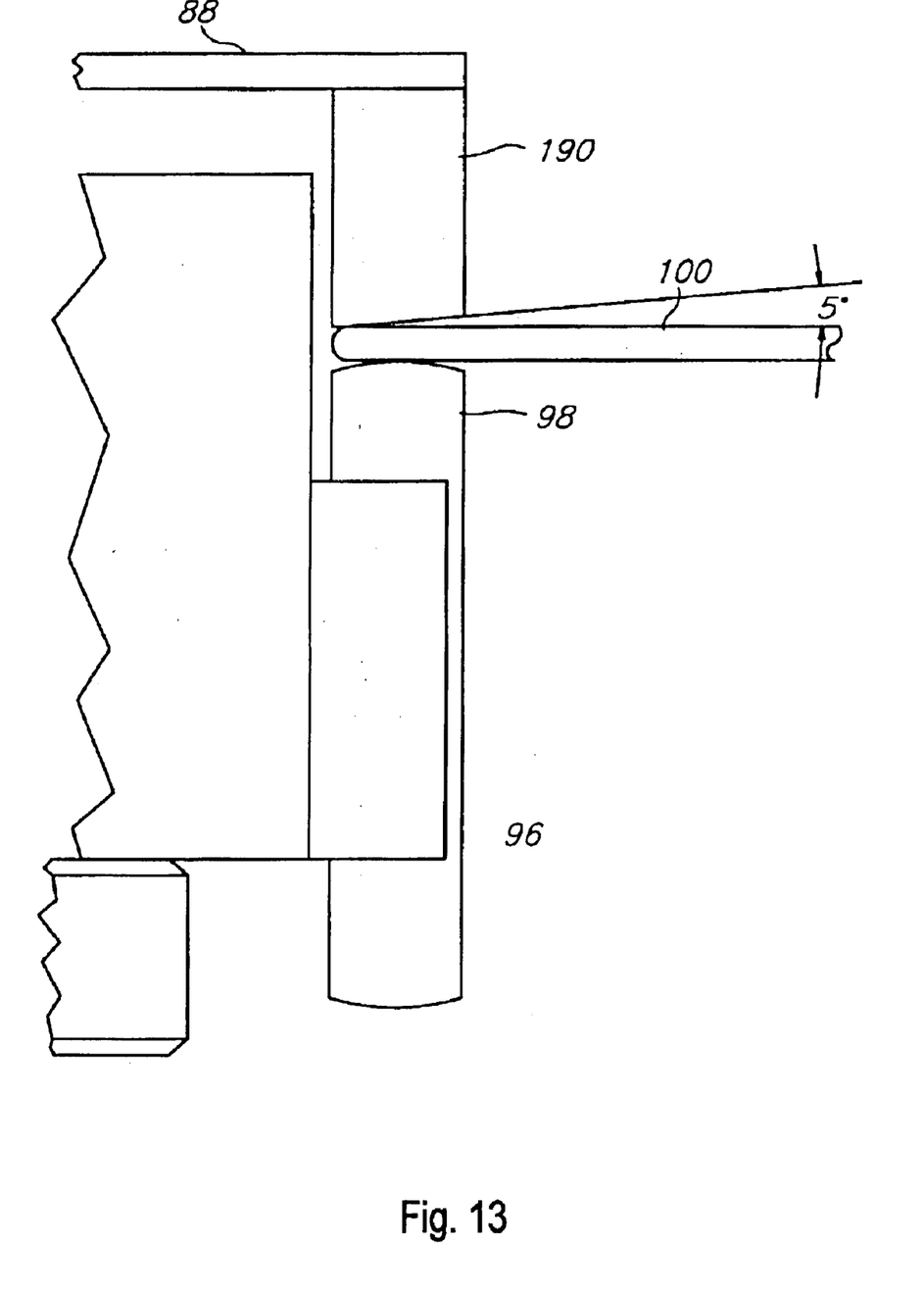
FIG. 13 is a variation of the feature shown in FIGS. 5 and 6.

Alternative clamp member geometry, as shown in FIG. 13, can be used where the moving clamp member is not allowed to touch any part of the flat surface on the corresponding side of the wafer 100. A linear, wedge-shaped clamp member 190 then takes the place of clamp member 90 (FIGS. 7,8,9) so that only the wafer 100 edge 6 geometry is contacted by the clamp member 190. While this still holds the wafer 100 captive and allows it to move under the force of gravity to the rest pins 92 as the pallet is rotated to the vertical orientation, a small moment is imparted between the rest member 98 point of contact with the bottom surface of the wafer 100 and the clamp member 190 point of tangency with the wafer 100 edge geometry. The angle or bevel of the clamp member 190 is approximately 5°, as shown in FIG. 13.

Subsequent to loading of a wafer 100 as described above, the pallet 30 then is rotated by the mechanism 36,38,39 and 40, as shown in FIG. 2, to its vertical orientation. This causes the cylindrical section rest pins 92 at the stations 56 and 57 to be located in the third and fourth quadrants of the opening 32 (and therefore, the third and fourth quadrants of a wafer 100), as shown in FIG. 2. When this occurs, the wafer 100 slides down, if it is not yet in contact with the rest pins 92, as shown in FIG. 9 by the arrow, to engage the surfaces of the rest pins 92, which contact the wafer edge tangentially. Thus, the rest pins 92 at the stations 56 and 57 bear the weight of the wafer while centering and constraining the wafer to a defined aperture field in the opening 32. The rest pins 92 provide a two-point reference for all wafers 100 with diameters within the specified dimensional tolerance for the wafers which are to be used with the particular pallet 30.

It should be noted that the clamping force which is applied between the members 90 and 98 is not intended to constrain the water 100 itself, but merely to constrain the vertical orientation of the wafer within the opening 32 in the pallet. The positioning of the bottom edge of the wafer is effected by the pins 92 at the stations 56 and 57. If the wafer 100 is not in contact with the pins 92 when the pallet 30 is in the horizontal position (for loading and unloading the wafer 100), the clamps 90/98 allow the wafer to slide down under the force of gravity to contact the rest pins 92 as the pallet 30 is moved to its vertical position. The wafer 100 undergoes a radial load from the rest pins 92, the total of which does not exceed the weight of the wafer 100.

FIG. 10 illustrates the position of the wafer 100 in the vertically oriented position of the pallet 30, clearly showing the manner in which the lower edge of the wafer 100 rests on the rest pins located at the stations 56 and 57. The stations 56,57,58 simultaneously hold the wafer 100 against the support rest members 98 at each of the three stations; so that the orientation of the wafer 100 with respect to the hole 32 in the pallet 30 is fixed and is known, once all of the adjustments of the various components comprising the stations 56,57 and 58 have been made. It should be noted that the diameter of the wafer 100 is equal to or less than the diameter of the hole 32 to expose the entire wafer surface to interferometric apparatus. Consistent orientation of different wafers 100 for subsequent utilization in an interferometric testing apparatus then takes place.

It has been found that when a pallet, such as the pallet 30 is placed in an interferometric apparatus, vibrations from the handling and release of the pallet 30 by means of the clamps 39 and 40, once it is in place in the interferometer, impart sufficient vibration to the wafer 100 or other substrate, that a relatively long period of time is required to allow the vibration to settle down in order to obtain accurate measurements.

Vibrations continuously coupled into the pallet from the host metrology system also can adversely affect the measurements. Furthermore, acoustic noise coupled directly from the air surrounding the wafer contributes to the wafer vibrations. Thus, it is desirable to include vibration damping devices directly into the pallet. Reference now should be made to FIGS. 14 to 19, which show such damping devices.

Figure 14:
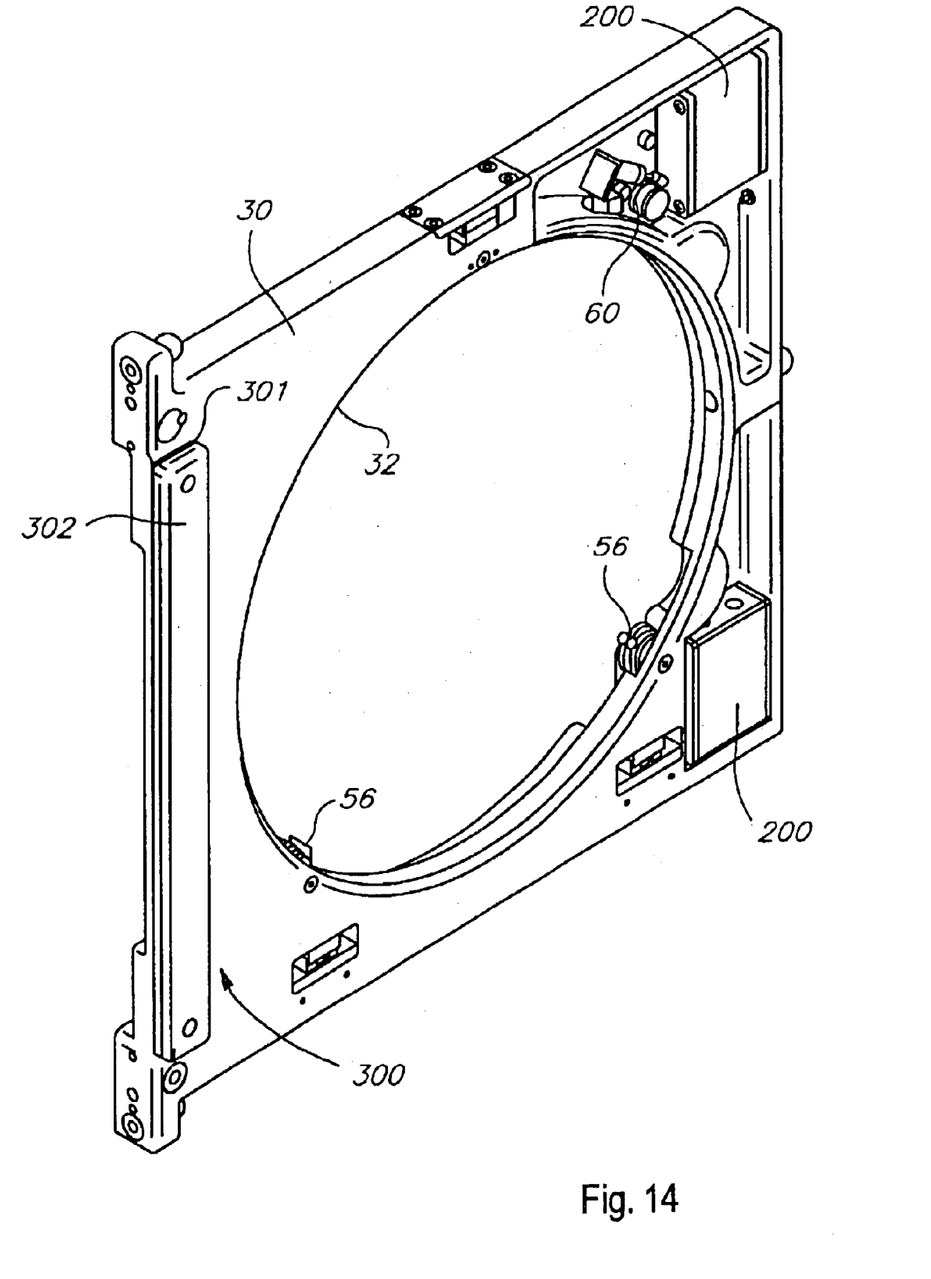
FIG. 14 is a rear perspective view of the embodiment shown in FIG. 10.
Figure 15:
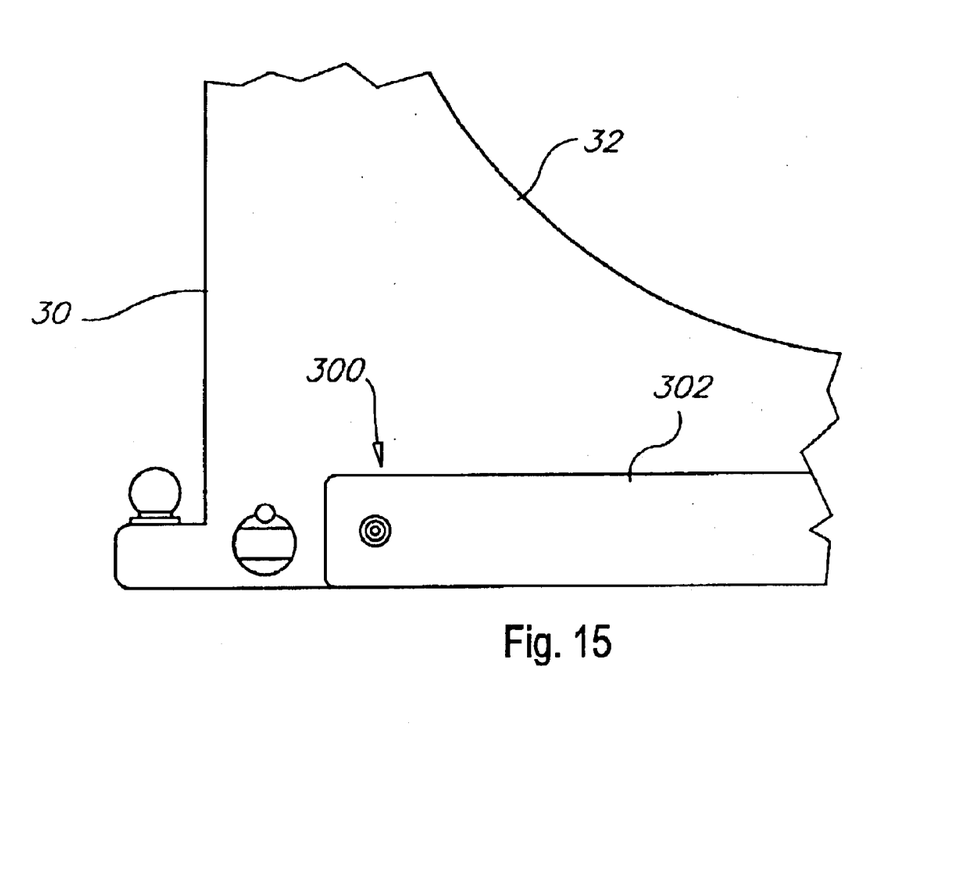
FIGS. 15 and 16 illustrate another feature of the invention.
Figure 16:
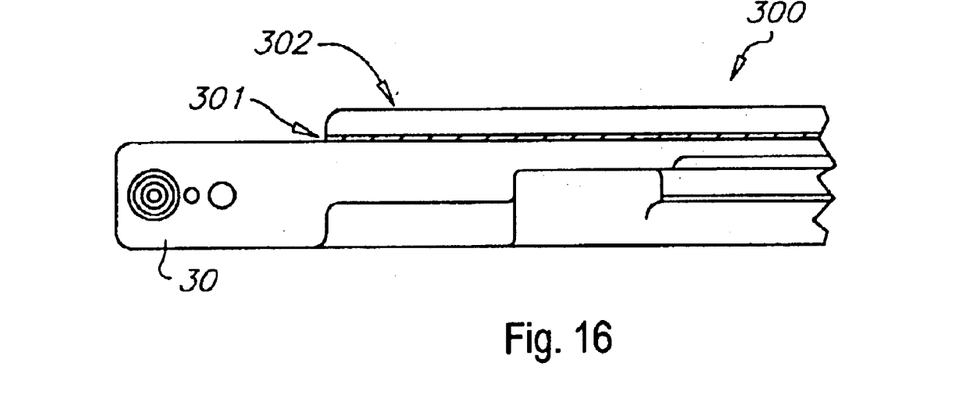
Figure 17:
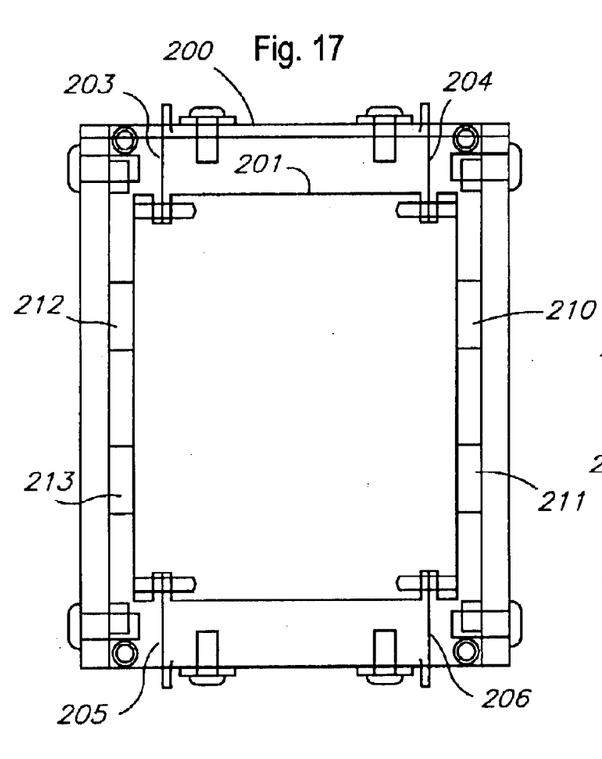
FIGS. 17 to 19 illustrate a further feature of the invention.
Figure 18:
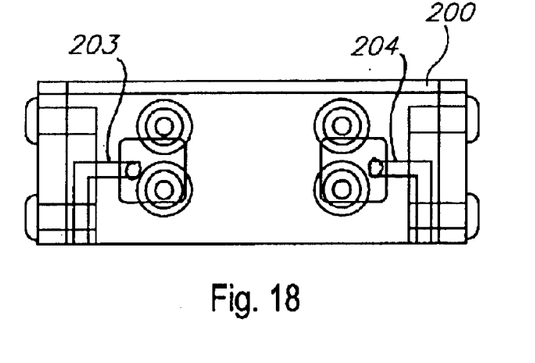
Figure 19:
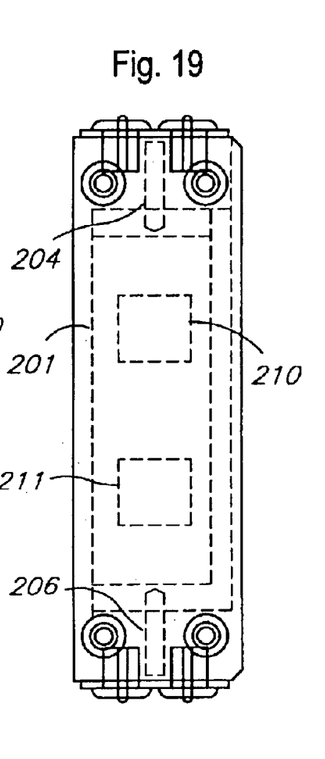

To damp the pallet vibrations, mechanical dampers are incorporated directly into the pallet frame. Two types of dampers are chosen according to the type of vibration and space restrictions. In two corners of the pallet 30, which show a large vibration amplitude for the lower vibration modes, there are two auxiliary mass dampers 200 installed. These dampers 200 are shown attached to the pallet 30 in the rear perspective view in FIG. 14. Each damper 200 consists of a damper mass 201 suspended on wires 203,204,205,206 and sandwiched in the block frame 200 between damping pads 210, 211, 212, 213 of visco-elastic material with a high mechanical loss factor, e.g. Sorbothane®. The arrangement is such that when the pallet 30 is in its vertical orientation, as shown in FIG. 14, the pallet vibrations cause the damper mass 201 to swing in and out of the drawing plane inducing a shear strain of the damping pads. When the pallet is horizontal, the suspension wires 203,204,205,206 prevent the damper mass from moving too much and shearing off the damping pads. By selecting the size and dynamic shear modulus of the damping material, the natural frequency of this heavily damped system is chosen to be below the lowest resonant frequency of the pallet 30.

The thin front side of the pallet 30 exhibits mostly bending strain during vibrations. Thus, along this side of the pallet 30 a thin constrained layer damper 300 is applied, which is particularly well suited to damp the bending of the pallet at that location. The constrained layer damper consists of a thin layer 301 of visco-elastic material attached to the pallet, with a thin metal constraining layer 302 on top of the layer 301. Thus, the pallet 30 can be damped very effectively, even in a limited space.

To damp the wafer vibrations directly without adversely affecting the wafer shape, the rest members 98 of the clamping assemblies 56,57, and 58 are made of a visco-elastic material, rather than contacting the wafer with additional dampers during critical measurements. The material parameters of the rest members 98 have to be chosen such that the wafer 100 is properly localized when it is clamped in the pallet 30 in the vertical orientation, i.e. only minor shape drift and compression set of the rest members 98 is allowed. Furthermore, the dynamic modulus of the material ensures that the wafer motion at the rest members 98 is below critical levels, but still compression cycles of the rest member 98 take place such that the vibration energy in the wafer is dissipated in the rest member 98. A good choice of material with little compression set and good vibration damping characteristic is Viton®. In an addition configuration, the rest members 98 may be of a non-damping material, but in turn are mounted on pads of damping material between the mounting block 96 and the rest member 98.

Figure 11:
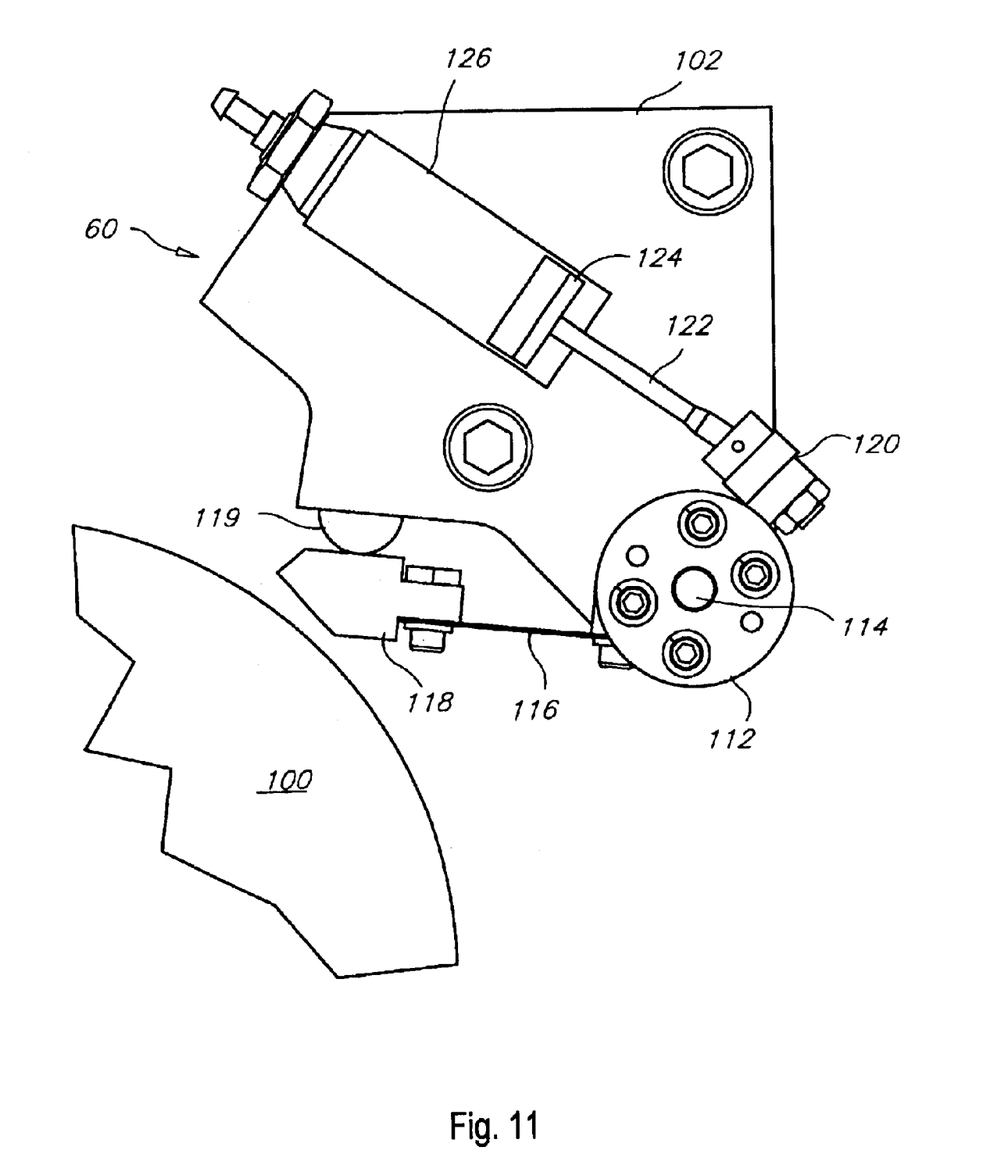
FIG. 11 is a detailed view of a portion of the embodiment shown in FIGS. 1 and 2 in one state of operation.
Figure 12:
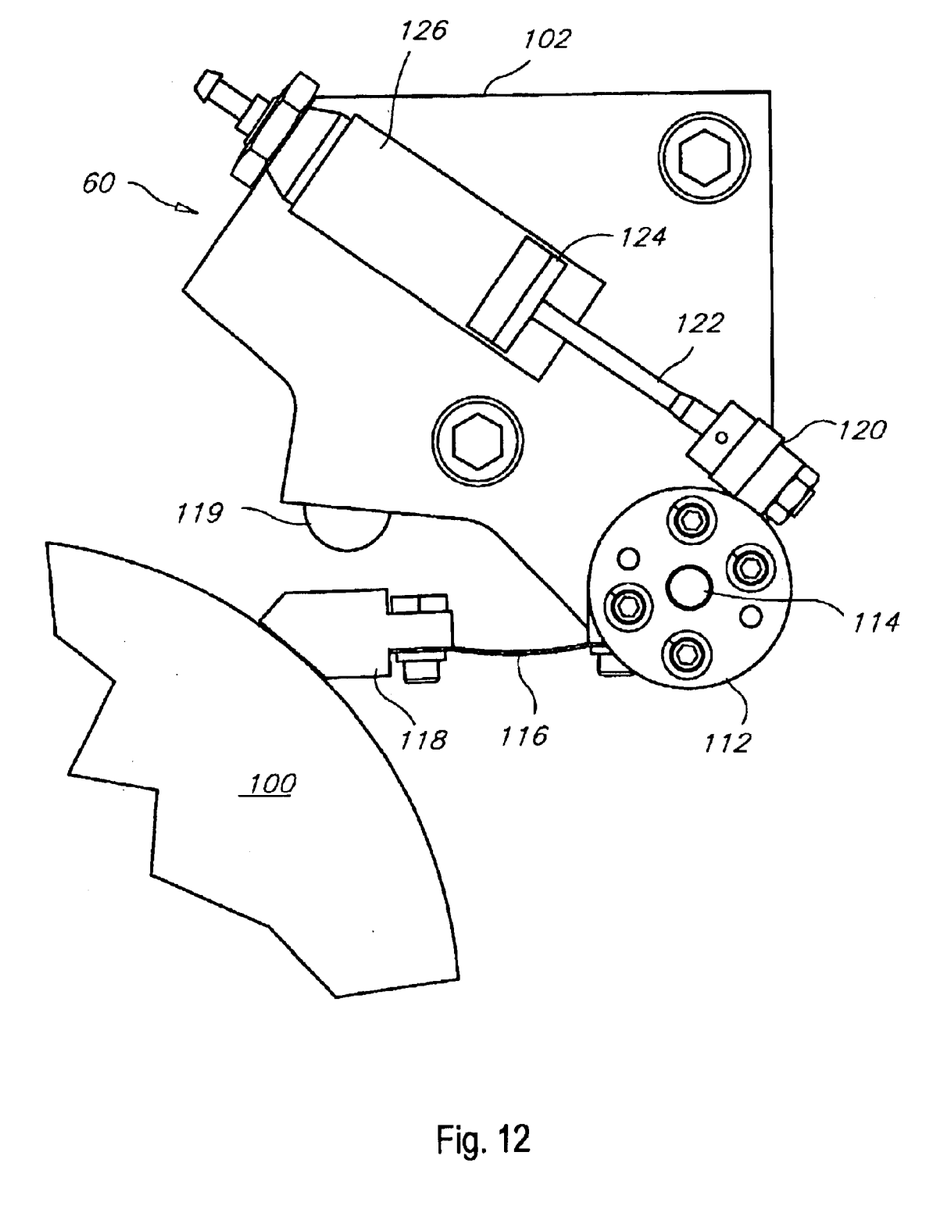
FIG. 12 is a detailed view of the portion shown in FIG. 11 in a different state of operation.

The strong, loading induced wafer vibrations are damped by a damper device 60 shown in FIGS. 2 and 10, located at the upper left-hand corner (as viewed in FIG. 10) of the hole 32 in the pallet 30 and adjacent the upper left edge of the wafer 100. FIGS. 11 and 12 show details of this damper mechanism. Essentially, the damper mechanism 60, which is mounted onto the pallet 30, is carried on a frame 102 and consists of a rotatable wheel 112 mounted on a pivot pin 114. A leaf spring 116 is carried by the pivot wheel 112, and the spring has a damper block 118 connected to its left-hand end, as viewed in FIGS. 11 and 12. In the rest position of the mechanism, the damper block 118 is resting against a rest surface 119 and is spaced away from the edge of the wafer 100 when the wafer is in its mounted position as described previously, and as shown in FIG. 11.

Once the pallet 30 has been moved into position for profiling and measurement, the damper mechanism 60 is operated. This is effected by operation of a pneumatic cylinder 126 to pull a piston toward the left, as viewed in FIGS. 10,11 and 12. A shaft 122 is attached to a coupler 120, which in turn is attached to the periphery of the circular wheel 112 to rotate the wheel 112 in a counterclockwise direction, as viewed in FIG. 12. This causes the spring 116 to move the damper block 118 into contact with the edge of the wafer 100. The force applied by the damper block 118 to the edge of the wafer 100, through the spring 116 is constrained by the characteristics of the spring, which typically exerts a force of 10 grams, but this force is widely adjustable. By utilization of the damper block 118, the minute vibrations imparted to the wafer 100 when it is seated in place in the interferometer are reduced from many seconds to a few seconds (typically, 5 seconds or less).

The materials used for the pallet 30, clamp members 90, rest members 98, rest pins 92, damper block 118, and rest surface 119 are selected based on a combination of vibration attenuation performance (loss factor), dimensional stability, and acceptability in the semiconductor metrology environment. For example, the pallet 30, in the preferred embodiment is cast aluminum plate, but could be fabricated using other alloyed materials, composite materials, reinforced cast or molded polymers, or a combination thereof. Clamp members 90, in the preferred embodiment, and clamp members 190 in the alternative embodiment, are fabricated from materials acceptable for wafer contact, e.g. Teflon®. Rest pins 92 are fabricated from engineering resins with excellent dimensional stability and strength; so that accurate, repeatable location of a wafer 100 is attained while the inherent lubricity of the rest pin material minimizes binding or dragging between wafer 100 and rest pins 92. Damper block 118 may be fabricated from a variety of polymeric materials with properties ranging from high loss factors to high dimensional stability. Rest surface 119 is fabricated from visco-elastic materials with high loss factors in order to quickly stabilize the mechanism once it reaches its retracted position. Stability of the surface 119 is not a factor.

The foregoing description of a preferred embodiment of the invention is to be considered illustrative and not as limiting. Various changes and modifications will occur to those skilled in the art for performing substantially the same function, in substantially the same way, to achieve substantially the same result without departing from the true scope of the invention as defined in the appended claims.

What is claimed is:

1. A device for vertically positioning relatively thin wafers of material in a metrology system including in combination:

a frame surrounding an opening dimensioned to be equal to or greater than the external diameter/width/length of a wafer to be positioned;

three fixed rest members spaced apart at the edge of the opening in the frame and extending into the opening;

three moving clamp members on the frame and located for movement toward and away from the corresponding fixed rest members to hold a wafer in place in the opening in the frame by clamping the wafer between the rest members and the clamp members; and two fixed rest pins located on one side of the opening in the frame to support a wafer when the frame is rotated 90° from a horizontal wafer loading/unloading position to a vertical position.

2. The device according to claim 1 wherein each of the three rest members and each of the three moving clamp members corresponding to the rest members comprise a clamp station, and wherein each of the clamp stations applies opposing forces across the wafer thickness.

3. The device according to claim 2 wherein two of the three rest members are located immediately adjacent different ones of the two fixed rest pins.

4. The device according to claim 3 wherein the three fixed rest members each has a curved surface tangential to the plane of the surface of a wafer supported thereon when the frame is in a horizontal position, and wherein each of the corresponding three moving clamp members includes a curved surface tangent to a plane parallel to the plane of the supported surface of the wafer.

5. The device according to claim 4 wherein the three fixed rest members are hemispherical or semi-cylindrical pads and the three moving clamp members are corresponding semi-spherical or semi-cylindrical pads each moving along a path perpendicular to the plane upon which each corresponding fixed pad contacts a wafer.

6. The device according to claim 5 wherein the three moving clamp members are spring-biased toward the three corresponding fixed rest members with a predetermined force.

7. The device according to claim 6 wherein the opening in the frame is a circular opening.

8. The device according to claim 7 wherein the two fixed rest pins are located symmetrically opposite one another in the third and fourth quadrants of a wafer supported in the device when the frame is rotated to a vertical position.

9. The device according to claim 8 wherein the opposing clamping force between the moving clamp members and the fixed rest members is such that when the frame is rotated to a vertical position, a wafer supported therein is allowed to move to contact the two fixed rest pins under gravitational force.

10. The device according to claim 1 wherein two of the three rest members are located immediately adjacent different ones of the two fixed rest pins.

11. The device according to claim 10 wherein each of the three rest members and each of the three moving clamp members corresponding to the rest members comprise a clamp station, and wherein each of the clamp stations applies opposing forces across the wafer thickness.

12. The device according to claim 11 wherein the opposing clamping force between the moving clamp members and the fixed rest members is such that when the frame is rotated to a vertical position, a wafer supported therein is allowed to move to contact the two fixed rest pins under gravitational force.

13. The device according to claim 1 wherein the three moving clamp members are spring-biased toward the three corresponding fixed rest members with a predetermined force.

14. The device according to claim 13 wherein the opposing clamping force between the moving clamp members and the fixed rest members is such that when the frame is rotated to a vertical position, a wafer supported therein is allowed to move to contact the two fixed rest pins under gravitational force.

15. The device according to claim 14 wherein the opening in the frame is a circular opening.

16. The device according to claim 1 wherein the three fixed rest members are semi-spherical or semi-cylindrical pads and the three moving clamp members are corresponding pads each moving along a path perpendicular to the plane upon which each corresponding fixed pad contacts a wafer.

17. The device according to claim 16 wherein the opening in the frame is a circular opening.

18. The device according to claim 17 wherein two of the three rest members are located immediately adjacent different ones of the two fixed rest pins.

19. The device according to claim 1 further including a movable damping member attached to the frame for engagement with the edge of a wafer supported in the frame.

20. The device according to claim 19 wherein the movable damping member is located on the frame to extend into the opening thereof.

21. The device according to claim 20 wherein the movable damping member is actuated to engage the edge of a wafer for a predetermined time interval.

22. The device according to claim 19 further including means attached to the frame for damping vibration of the frame.

23. The device according to claim 22 wherein the means for damping includes at least one auxiliary mass damper.

24. The device according to claim 22 wherein the means for damping includes a constrained layer damper.

25. The device according to claim 1 further including means attached to the frame for damping vibration of the frame.

26. The device according to claim 25 wherein the means for damping includes at least one auxiliary mass damper.

27. The device according to claim 26 wherein the means for damping further includes a constrained layer damper.

28. The device according to claim 25 wherein the means for damping includes a constrained layer damper.

29. A method for vertically positioning relatively thin wafers of material for imaging in a metrology system comprising the steps of:
    providing a frame surrounding an opening dimensioned to be equal to or greater than the external dimensions of a wafer to be positioned;
    orienting the frame in a horizontal position;
    clamping a wafer in the opening in the frame on rest members spaced apart at the edge of the opening;
    rotating the frame from a horizontal position to a vertical position; and
    allowing the wafer to move under the force of gravity to rest on a pair of spaced apart fixed rest pins extending into the opening at the bottom of the frame when it is in its vertical position.

30. The method according to claim 29 wherein the step of clamping the wafer comprises clamping the wafer between the fixed rest members and moving clamp members with a predetermined force directly across the wafer thickness.

31. The method according to claim 30 wherein the step of allowing the wafer to move under the force of gravity to rest on the rest pins when the frame is rotated to its vertical position further includes clamping the wafer with a force weak enough to allow such movement.

32. The method according to claim 29 further including the step of locating the rest pins adjacent two of the clamping members.

33. The method according to claim 29 further including the step of damping vibration of the frame.

* * * * *